(12) United States Patent
Yang et al.

(10) Patent No.: US 12,302,489 B2
(45) Date of Patent: May 13, 2025

(54) CIRCUIT BOARD MODULE AND TOUCH DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Xianfeng Yang, Beijing (CN); Xianlei Bi, Beijing (CN); Chuanyan Lan, Beijing (CN); Qian Ma, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/744,990

(22) Filed: Jun. 17, 2024

(65) Prior Publication Data

US 2024/0341028 A1 Oct. 10, 2024

Related U.S. Application Data

(63) Continuation of application No. 17/772,185, filed as application No. PCT/CN2021/081862 on Mar. 19, 2021, now Pat. No. 12,048,086.

(51) Int. Cl.
*H05K 1/02* (2006.01)
*G06F 3/041* (2006.01)
*H05K 1/14* (2006.01)

(52) U.S. Cl.
CPC ......... *H05K 1/0218* (2013.01); *G06F 3/0416* (2013.01); *H05K 1/144* (2013.01);
(Continued)

(58) Field of Classification Search
None
See application file for complete search history.

(56) References Cited

U.S. PATENT DOCUMENTS

2002/0173192 A1 11/2002 Heilbronner
2008/0080142 A1 4/2008 Chen et al.
(Continued)

FOREIGN PATENT DOCUMENTS

CN 103379723 A 10/2013
CN 105430882 A 3/2016
(Continued)

OTHER PUBLICATIONS

PCT International Search Report and Written Opinion (with English Translation) for corresponding PCT Application No. PCT/CN2021/081862, mailed Oct. 26, 2021, 23 pages.
(Continued)

*Primary Examiner* — Stephen T. Reed
(74) *Attorney, Agent, or Firm* — Dority & Manning, P.A.

(57) ABSTRACT

A circuit board module relates to the field of touch technologies. The above circuit board module includes a touch chip, a first circuit board, a second circuit board and at least one conductive connection portion. The touch chip includes at least one ground pin and a plurality of signal pins. The first circuit board includes a first ground portion and a plurality of signal pads; the signal pads are electrically connected to the signal pins; the first ground is electrically connected to the at least one ground pin. The second circuit board includes a second ground portion. The at least one conductive connection portion is electrically connected to the first ground portion and the second ground portion.

20 Claims, 8 Drawing Sheets

(52) U.S. Cl.
CPC .............. *G06F 2203/04107* (2013.01); *H05K 2201/041* (2013.01)

(56) References Cited

U.S. PATENT DOCUMENTS

| | | | |
|---|---|---|---|
| 2011/0214924 A1 | 9/2011 | Perezselsky et al. | |
| 2011/0315536 A1 | 12/2011 | Chiou et al. | |
| 2013/0284504 A1* | 10/2013 | Tang ................... | H05K 1/0259 174/262 |
| 2017/0229486 A1 | 8/2017 | Matsuda et al. | |
| 2018/0150166 A1* | 5/2018 | Aoki ..................... | G06F 3/0443 |
| 2020/0142523 A1 | 5/2020 | Huang et al. | |
| 2020/0211949 A1 | 7/2020 | Strong et al. | |
| 2020/0279829 A1 | 9/2020 | Elsherbini et al. | |
| 2020/0286745 A1 | 9/2020 | Elsherbini et al. | |
| 2023/0008693 A1* | 1/2023 | Huang ................... | H05K 1/115 |

FOREIGN PATENT DOCUMENTS

| | | |
|---|---|---|
| CN | 210575941 U | 5/2020 |
| CN | 111880679 A | 11/2020 |

OTHER PUBLICATIONS

Partial European Search Report for corresponding EP Application No. 21930896.2, dated Jul. 17, 2023, 13 pages.
Extended European Search Report received in corresponding EP Application No. 21930896.2, dated Nov. 28, 2023, 12 pages.
Notice of Allowance received in corresponding U.S. Appl. No. 17/772,185, dated Apr. 10, 2024, 12 pages.

* cited by examiner

CIRCUIT BOARD MODULE AND TOUCH DISPLAY APPARATUS

CROSS-REFERENCE TO RELATED APPLICATIONS

This application is a continuation of U.S. patent application Ser. No. 17/772,185, filed on Apr. 27, 2022, which is a national phase entry under 35 USC 371 of International Patent Application No. PCT/CN2021/081862 filed on Mar. 19, 2021, which are incorporated herein by reference in their entirety.

TECHNICAL FIELD

The present disclosure relates to the field of touch technologies, and in particular, to a circuit board module and a touch display apparatus.

BACKGROUND

Electrostatic discharge (ESD) refers to a charge transfer of caused by approaching or direct contact of objects with different electrostatic potentials. ESD is a near-field hazard source with an extremely high degree of hazard, which may generate high voltages, strong electric fields, instantaneous large currents, and have strong electromagnetic radiation. If a display module or a circuit board of a touch display apparatus has a weak capability of ESD resistance, display function or touch function thereof is often abnormal in practical applications, and the touch display apparatus may even be damaged.

SUMMARY

In an aspect, a circuit board module is provided. The circuit board module includes a touch chip, a first circuit board, a second circuit board and at least one conductive connection portion. The touch chip includes at least one ground pin and a plurality of signal pins. The first circuit board includes a first ground portion and a plurality of signal pads, and the signal pads are electrically connected to the signal pins. The first ground portion is electrically connected to the at least one ground pin. The second circuit board includes a second ground portion. The at least one conductive connection portion is electrically connected to the first ground portion and the second ground portion. A ratio of an area of the second ground portion to an area of the second circuit board is in a range of 0.1 to 0.2, inclusive.

In some embodiments, the first circuit board includes a first surface and a second surface that are disposed oppositely. The plurality of signal pads are located on the first surface, the touch chip is located on the first surface, and the second circuit board is located on a side of the second surface away from the touch chip. The conductive connection portion is located between the first circuit board and the second circuit board.

In some embodiments, the conductive connection portion includes: a metal support layer located on the side of the second surface away from the touch chip; a first conductive adhesive located between the metal support layer and the first circuit board and used for bonding and electrically connecting the metal support layer to the first circuit board; and a second conductive adhesive located between the metal support layer and the second circuit board and used for bonding and electrically connecting the metal support layer to the second circuit board.

In some embodiments, a thickness of the metal support layer is in a range of 0.05 mm to 0.3 mm, inclusive; and/or a thickness of the first conductive adhesive is in a range of 0.02 mm to 0.08 mm, inclusive.

In some embodiments, the metal support layer is a whole flat plate made of a stainless steel material.

In some embodiments, an orthographic projection of the touch chip on the second circuit board is completely within an orthographic projection of the metal support layer on the second circuit board.

In some embodiments, the first ground portion includes at least one first via hole penetrating the first circuit board. A first end of a first via hole is electrically connected to a ground pin of the touch chip, and a second end of the first via hole is electrically connected to a conductive connection portion.

In some embodiments, the first circuit board includes a first metal pattern layer, a second metal pattern layer, and a first substrate located between the first metal pattern layer and the second metal pattern layer. The first ground portion includes: a plurality of ground pads, a ground pad being electrically connected to a ground pin; a plurality of first ground leads, a first end of a first ground lead being electrically connected to the ground pad, the plurality of first ground leads being disposed in the first metal pattern layer; a plurality of second via holes, a first end of a second via hole being electrically connected to a second end of the first ground lead, the second via holes penetrating the first substrate; and a metal ground pattern electrically connected to a second end of the second via hole and the conductive connection portion, the metal ground pattern being disposed in the second metal pattern layer.

In some embodiments, a ratio of an area of the metal ground pattern to an area of the first circuit board is in a range of 0.1 to 0.2, inclusive; and/or the area of the metal ground pattern is smaller than the area of the second ground portion.

In some embodiments, at least one of the first metal pattern layer and the second metal pattern layer includes a plurality of touch lines. First ends of the touch lines are electrically connected to the touch chip.

In some embodiments, the circuit board module further includes: a first insulating layer located on a side of the first metal pattern layer away from the first substrate and bonded to the first metal pattern layer, the first insulating layer being provided with a first opening therein, and the touch chip being disposed in the first opening; and a second insulating layer located on a side of the second metal pattern layer away from the first substrate and bonded to the second metal pattern layer, the second insulating layer being provided with a second opening therein, and the conductive connection portion being disposed in the second opening.

In some embodiments, the circuit board module further includes at least one transient voltage suppressor (TVS) electrically connected to the first circuit board and located in the first opening.

In some embodiments, an orthogonal projection of a region where the touch chip and the TVS are located on the second circuit board is completely within an orthographic projection of the metal support layer on the second circuit board.

In some embodiments, the second circuit board includes a fourth metal pattern layer, a fifth metal pattern layer, and a second substrate located between the fourth metal pattern layer and the fifth metal pattern layer. The second ground portion is disposed in the fourth metal pattern layer. Alternatively, the second ground portion is disposed in the fifth metal pattern layer; the second circuit board further includes a third via hole, and the third via hole penetrates the fourth metal pattern layer and the second substrate; a first end of the third via hole is electrically connected to the conductive connection portion, and a second end of the third via hole is electrically connected to the second ground portion.

In some embodiments, at least one of the fifth metal pattern layer and the fourth metal pattern layer includes a plurality of display signal lines.

In some embodiments, the circuit board module further includes: a third insulating layer located on a side of the fourth metal pattern layer away from the second substrate and bonded to the fourth metal pattern layer, the third insulating layer being provided with a third opening therein, and the at least one conductive connection portion being disposed in the third opening; and a fourth insulating layer located on a side of the fifth metal pattern layer away from the second substrate and bonded to the fifth metal pattern layer.

In some embodiments, the third insulating layer includes an insulating substrate and a first double-sided adhesive tape. The first double-sided adhesive tape is located between the insulating substrate and the second circuit board, and is configured to bond the insulating substrate to the second circuit board.

In some embodiments, the circuit board module further includes an electromagnetic shielding layer located on a side of the fourth insulating layer away from the second substrate.

In some embodiments, the circuit board module further includes a carrier plate; and the carrier plate includes a foam located on a side of the electromagnetic shielding layer away from the fourth insulating layer, and a grid adhesive located on a side of the foam away from the electromagnetic shielding layer.

In some embodiments, the first insulating layer and the second insulating layer have a same structure and are made of a same material.

In another aspect, a touch display apparatus is provided. The touch display apparatus includes a touch display screen and a circuit board module. The circuit board module includes a touch chip, a first circuit board, a second circuit board and at least one conductive connection portion. The touch chip includes at least one ground pin and a plurality of signal pins. The first circuit board is electrically connected to the touch display screen and includes a first ground portion and a plurality of signal pads. The signal pads are electrically connected to the signal pins, so that the touch chip is electrically connected to the touch display screen through the first circuit board. The first ground portion is electrically connected to the at least one ground pin. The second circuit board includes a second ground portion. The at least one conductive connection portion is electrically connected to the first ground portion and the second ground portion. A ratio of an area of the second ground portion to an area of the second circuit board is in a range of 0.1 to 0.2, inclusive.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these accompanying drawings. In addition, the accompanying drawings in the following description may be regarded as schematic diagrams, but are not limitations on actual sizes of products, actual processes of methods and actual timings of signals involved in the embodiments of the present disclosure.

DETAILED DESCRIPTION

Figure 1:
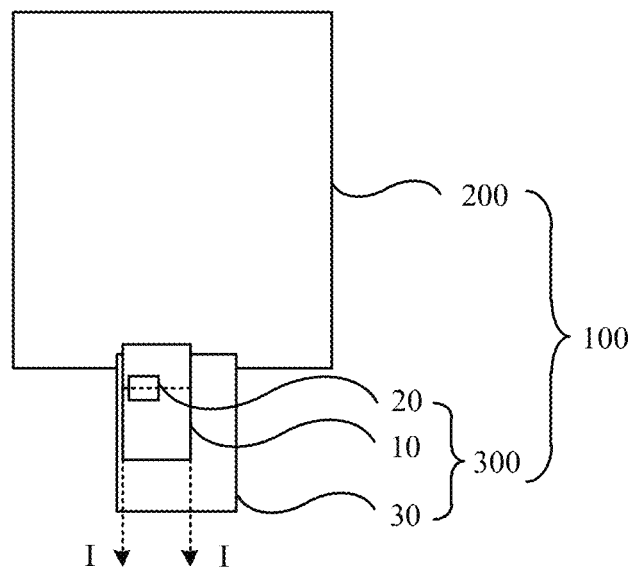
FIG. 1 is a diagram showing a structure of a touch display apparatus, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representation of the above term does not necessarily refer to the same embodiment(s) or examples(s). In addition, the specific features, structures, materials, or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined by "first" and "second" may explicitly or implicitly include one or more of the features.

In the description of the embodiments of the present disclosure, unless otherwise specified, the term "a plurality of" or "the plurality of" means two or more, and the term "at least one" means one or more than one.

In the embodiments of the present disclosure, in a case where the number of components is not limited, there may be one component or a plurality of components.

In the description of some embodiments, the terms "coupled" and "connected" and their extensions may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context.

The use of "applicable to" or "configured to" herein means an open and inclusive expression, which does not exclude devices that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

As used herein, "about", "substantially" or "approximately" includes a stated value and an average value within an acceptable range of deviation of a particular value. The acceptable range of deviation is determined by a person of ordinary skill in the art in view of measurement in question and errors associated with the measurement of a particular quantity (i.e., the limitations of a measurement system).

Exemplary embodiments are described herein with reference to sectional views and/or plan views as idealized exemplary drawings. In the accompanying drawings, thicknesses of layers and sizes of regions are enlarged for clarity. Therefore, variations in shapes with respect to the accompanying drawings due to, for example, manufacturing technologies and/or tolerances may be envisaged. Therefore, exemplary embodiments should not be construed to be limited to the shapes of regions shown herein, but to include deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

With a rapid development of display technologies, people have higher and higher requirements for anti-static capabilities of apparatuses with touch display function. In order to improve the anti-static capabilities of the touch display apparatuses, some embodiments of the present disclosure provide a circuit board module 300 shown in FIG. 1. The circuit board module 300 may be applied to a touch display apparatus 100, so that the anti-static capability of the touch display apparatus 100 may be improved through the circuit board module 300. The touch display apparatus may include one of electronic products with the touch display function such as a mobile phone, a tablet computer, a television or a smart wearable product (e.g., a smart watch or a smart wristband). The embodiments of the present disclosure do not limit a form of the touch display apparatus 100. A structure of the touch display apparatus 100 will be described in detail below.

In some embodiments of the present disclosure, as shown in FIG. 1, the touch display apparatus 100 may include a touch display screen 200 and the circuit board module 300. The circuit board module 300 is electrically connected to the touch display screen 200, and the circuit board module 300 may transmit touch signals and display signals to the touch display screen 200.

For example, in order to transmit the touch signals and the display signals, as shown in FIG. 1, the circuit board module 300 may include a first circuit board 10 and a second circuit board 30. The first circuit board 10 is electrically connected to the touch display screen 200 and used for transmitting the touch signals. In order to process the touch signals, the circuit board module 300 further includes a touch chip 20. The touch chip 20 is electrically connected to the first circuit board 10, and the touch chip 20 may receive the touch signals from the touch display screen 200 through the first circuit board 10 and process the touch signals. In addition, the second circuit board 30 is electrically connected to the touch display screen 200 and is further electrically connected to a display driving chip (not shown in the figures). The display driving chip may transmit the display signals to the touch display screen 200 through the second circuit board 30. In this case, the first circuit board 10 may be a touch circuit board (such as a touch flexible printed circuit (TFPC)) that transmits the touch signals, and the second circuit board 30 may be a main circuit board (such as a main flexible printed circuit (MFPC)) that transmits the display signals.

The manner in which the first circuit board 10 in the circuit board module 300 transmits the touch signals and the manner in which the second circuit board 30 in the circuit board module 300 transmits display driving signals will be described in detail below.

Figure 2:
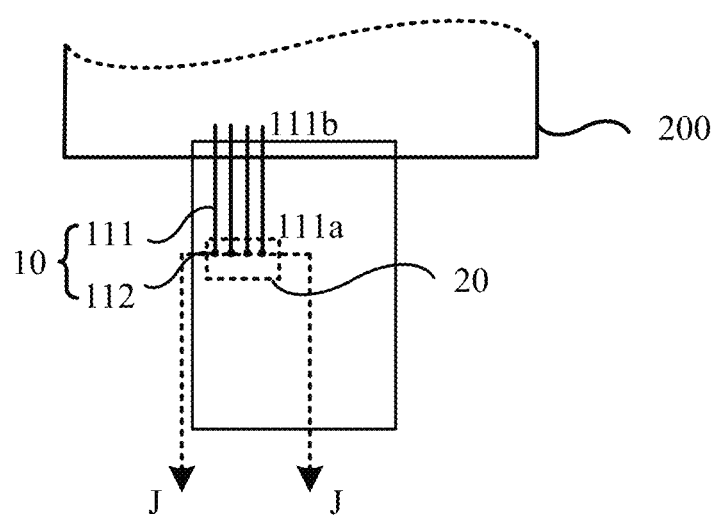
FIG. 2 is a diagram showing a structure of another touch display apparatus, in accordance with some embodiments.

As shown in FIG. 2, in some embodiments of the present disclosure, the first circuit board 10 may include a plurality of touch lines 111 and a plurality of signal pads 112. The touch chip 20 is electrically connected to the plurality of signal pads 112. A first end 111a of a touch line 111 is electrically connected to a signal pad 112, and a second end 111b of the touch line 111 is electrically connected to the touch display screen 200. In this way, the touch chip 20 may be electrically connected to the touch display screen 200 through the plurality of touch lines 111 in the first circuit board 10, so as to receive touch detection signals from the touch display screen 200.

Figure 3:
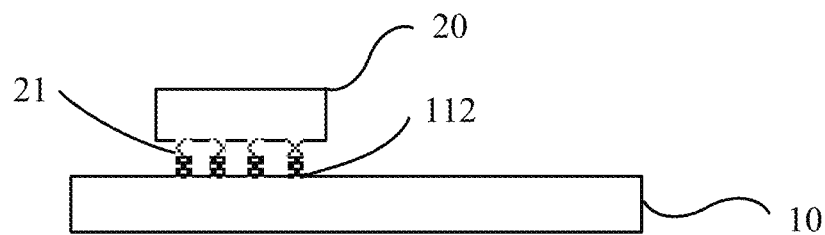
FIG. 3 is a cross-sectional view of the touch display apparatus in FIG. 2 taken along the J-J direction.

Based on this, in order to electrically connect the touch chip 20 with the plurality of signal pads 112, as shown in FIG. 3 (FIG. 3 is a cross-sectional view taken along the J-J direction in FIG. 2), the touch chip 20 includes a plurality of signal pins 21. A single signal pin 21 may be electrically connected to the signal pad 112.

Figure 4:
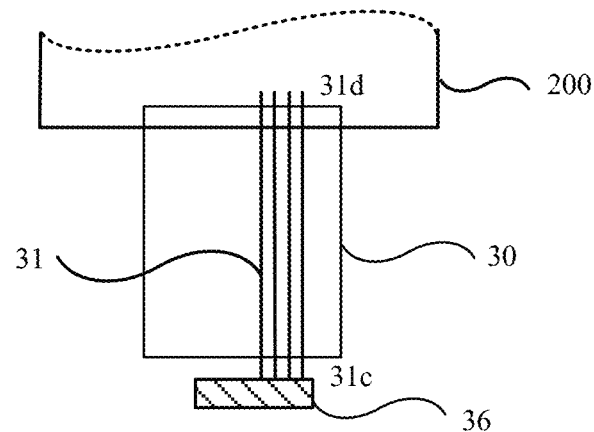
FIG. 4 is a diagram showing a structure of yet another touch display apparatus, in accordance with some embodiments.

In addition, as shown in FIG. 4, the second circuit board 30 may include a plurality of display signal lines 31. A first end 31c of a display signal line 31 may be electrically connected to a control mainboard 36 of the touch display apparatus, a second end 31d of the display signal line 31 is electrically connected to the touch display screen 200. The display driving chip may be disposed on the second circuit board 30. In this way, the control mainboard 36 may be electrically connected to the touch display screen 200 through the plurality of display signal lines 31 in the second circuit board 30, and the display driving chip may be used to provide the display driving signals to the touch display screen 200, thereby realizing transmission of the display signals. As a result, display images may be formed on the touch display screen 200.

It will be noted that numbers of the touch lines 111, the signal pads 112, the signal pins 21, and the display signal lines 31 are not limited in the embodiments of the present disclosure. In addition, positions of the touch lines 111 in the first circuit board 10 and positions of the display signal lines 31 in the second circuit board 30 are not limited in the embodiments of the present disclosure.

Moreover, in order to determine anti-static capabilities of produced display modules or produced circuit boards in practical applications, electrostatic discharge (ESD) tests need to be performed before the display modules or the circuit boards leave a factory, and the anti-static capabilities of the products may be determined according to obtained results of the ESD tests. Currently, the touch chips 20 generally adopt fragile wafer level chip scale packaging (WLCSP), which is sensitive to ESD. In an ESD test process, an internal circuit of the touch chip is easy to be open due to the instantaneous large current generated by ESD, which results in that the touch chip may not receive the touch signals, and further results in a touch failure of the touch display apparatus. The circuit board module 300 provided by the embodiments of the present disclosure may improve the anti-static capability of the touch display apparatus 100, and may also improve the anti-static capability of the touch chip 20, thereby reducing the touch failure of the touch display apparatus 100 caused by a damage of the touch chip 20 during the ESD test process.

Some embodiments of the present disclosure provide two types of circuit board modules 300 with different structures. In the following, the manner in which the two types of circuit board modules 300 with different structures each improve the anti-static capability of the touch chip 20 and reduce the touch failure of the touch display apparatus 100 in practical applications will be described in detail.

Figure 5:
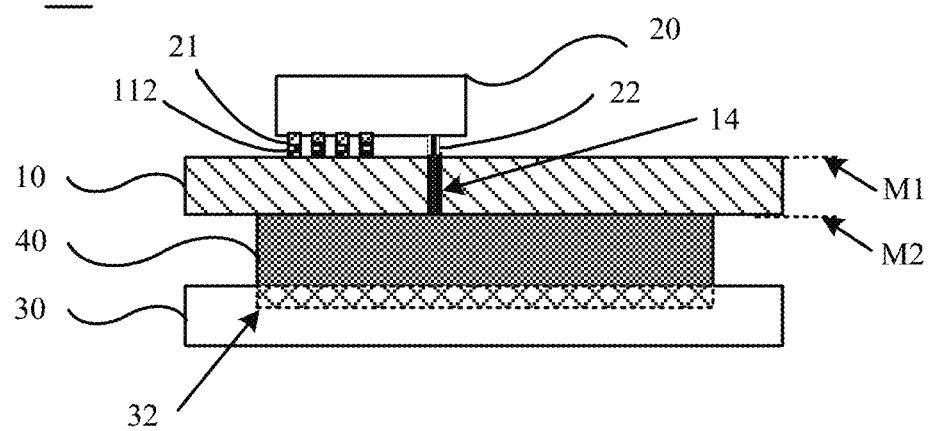
FIG. 5 is a cross-sectional view of a circuit board module in FIG. 1 taken along the I-I direction.

Example 1: in this example, a structure of the circuit board module 300 is shown in FIG. 5 (FIG. 5 is a cross-sectional view taken along the I-I direction in FIG. 1). It will be seen from the above that the circuit board module 300 may include the first circuit board 10, the touch chip 20, the second circuit board 30 and a conductive connection portion 40. In this example, the first circuit board 10 and the second circuit board 30 are arranged sequentially. For example, as shown in FIG. 5, in a case where the first circuit board 10 includes a first surface M1 and a second surface M2 that are disposed oppositely, the second circuit board 30 may be disposed on a side where the second surface M2 of the first circuit board 10 is located.

In addition, the plurality of signal pads 112 are located on the first surface M1 of the first circuit board 10. The touch chip 20 is located on a side where the first surface M1 is located. Moreover, the first circuit board 10 further includes a first ground portion 14, and the second circuit board 30 includes a second ground portion 32. The conductive connection portion 40 is located between the first circuit board 10 and the second circuit board 30, and the conductive connection portion 40 electrically connects the first ground portion 14 of the first circuit board 10 to the second ground portion 32 of the second circuit board 30. The second ground portion 32 is a zero-potential region with a certain area. In some embodiments of the present disclosure, the second ground portion 32 may be electrically connected to a ground terminal of the control mainboard 36. In some other embodiments of the present disclosure, the second ground portion 32 may also exist separately.

In some embodiments of the present disclosure, a ratio of an area of the second ground portion 32 to an area of the second circuit board 30 is V, and the ratio V is greater than or equal to 0.1 and less than or equal to 0.2 ($0.1 \leq V \leq 0.2$). In a case where the ratio V is less than 0.1, the area of the second ground portion 32 is small, which results in a poor effect on reducing grounding impedance of the touch chip 20. In a case where the ratio V is greater than 0.2, a wiring space for display signal lines 31 of the second circuit board 30 will be reduced, which is not beneficial to a wiring design of the display signal lines 31. Therefore, in a case where the ratio V is within the above range, the grounding impedance of the touch chip 20 may be significantly reduced while satisfying a reasonable wiring space for the second circuit board 30, thereby improving the anti-static capability of the touch chip 20. It will be noted that, a shape of the second ground portion 32 is not limited in the embodiments of the present disclosure.

In addition, in order to ground the touch chip 20, as shown in FIG. 5, the touch chip 20 may further include ground pin(s) 22. In this case, the ground pin(s) 22 may be electrically connected to the first ground portion 14. In this case, the ground pin(s) 22 of the touch chip 20 may be electrically connected to the second ground portion 32 through the first ground portion 14 and the conductive connection portion 40 in sequence.

In this way, in the circuit board module 300, a grounding network is formed for the touch chip 20. The grounding network may include the ground pin(s) 22, the first ground portion 14, the conductive connection portion 40 and the second ground portion 32. Through the grounding network, the grounding for the touch chip 20 may be realized, so that in the ESD test process, a network channel for electrostatic discharge is provided for the touch chip 20, thereby avoiding the touch failure caused by the open of the internal circuit of the touch chip 20 due to the instantaneous large current generated during the ESD test.

For example, in a case where an air ESD test is performed on the circuit board module 300 of the embodiments of the present disclosure, the circuit board module 300 may withstand an ESD impact of 16 KV, alternatively, in a case where a contact ESD test is performed on the circuit board module 300 of the embodiments of the present disclosure, the circuit board module 300 may withstand an ESD impact of 8 KV, while a circuit board in the prior art may only withstand an ESD impact of 8 KV in the air ESD test, and may only withstand an ESD impact of 4 KV in the contact ESD test. It will be seen that the anti-static capability of the circuit board module provided by the embodiments of the present disclosure may be significantly enhanced.

In the embodiments of the present disclosure, there are two manners to arrange the second ground portion 32 in the second circuit board 30, and the two arrangement manners of the second ground portion 32 will be described below.

Figure 6:
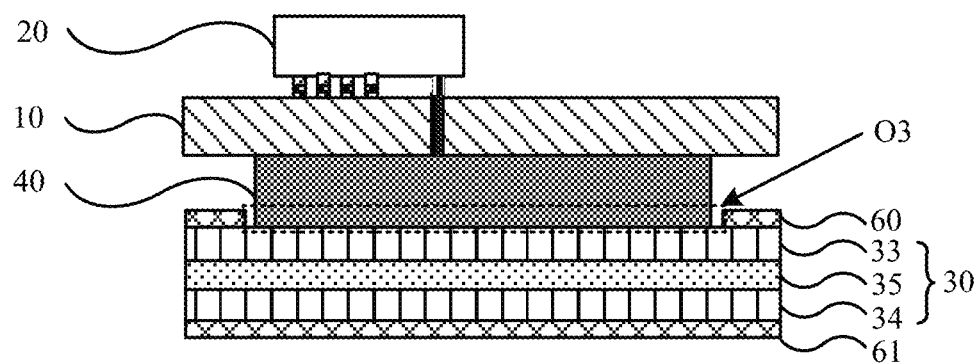
FIG. 6 is another cross-sectional view of a circuit board module in FIG. 1 taken along the I-I direction.

For example, as shown in FIG. 6, the second circuit board 30 may include a fourth metal pattern layer 33, a fifth metal pattern layer 34, and a second substrate 35 between the fourth metal pattern layer 33 and the fifth metal pattern layer 34. The fourth metal pattern layer 33 is located on a side of the conductive connection portion 40 away from the first circuit board 10.

In some embodiments of the present disclosure, the second substrate 35 may be a flexible substrate, which may be, for example, a polyethylene terephthalate (PET) substrate, a polyethylene naphthalate two formic acid glycol ester (PEN) substrate, or a polyimide (PI) substrate. The second substrate 35 may also be a rigid substrate, which may be, for example, a polymethyl methacrylate (PMMA) substrate.

In addition, materials of the fourth metal pattern layer 33 and the fifth metal pattern layer 34 are not limited in the embodiments of the present disclosure. For example, the materials of the fourth metal pattern layer 33 and the fifth metal pattern layer 34 may be copper with good conductivity. Moreover, the display signal lines 31 may be disposed on a same layer and made of a same material as the fourth metal pattern layer 33, alternatively, the display signal lines 31 may also be disposed on a same layer and made of a same material as the fifth metal pattern layer 34.

Based on this, in order to perform insulating protection on the fourth metal pattern layer 33 and the fifth metal pattern layer 34, with continued reference to FIG. 6, the circuit board module 300 further includes a third insulating layer 60 and a fourth insulating layer 61. The third insulating layer 60 is located on a side of the fourth metal pattern layer 33 away from the second substrate 35, and is bonded to the fourth metal pattern layer 33. The fourth insulating layer 61 is located on a side of the fifth metal pattern layer 34 away from the second substrate 35, and is bonded to the fifth metal pattern layer 34.

In this way, the third insulating layer 60 and the fourth insulating layer 61 are provided in the second circuit board 30, so that insulating protection may be performed on the fourth metal pattern layer 33 and the fifth metal pattern layer 34. Based on this, in order to electrically connect the conductive connection portion 40 to the second circuit board 30, the third insulating layer 60 is provided with a third opening O3 therein. In this case, the conductive connection portion 40 is disposed in the third opening O3.

Figure 7:
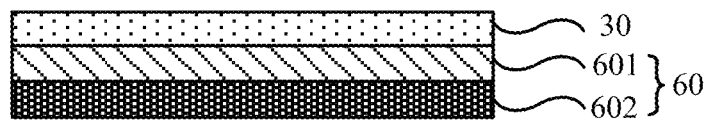
FIG. 7 is a cross-sectional view of a portion of a circuit board module, in accordance with some embodiments.

In some embodiments of the present disclosure, as shown in FIG. 7, the third insulating layer 60 may include an insulating substrate 602 and a first double-sided adhesive tape 601. The insulating substrate 602 is located on a side of the first double-sided adhesive tape 601 away from the second circuit board 30, and the first double-sided adhesive tape 601 is located between the insulating substrate 602 and the second circuit board 30, and bonds the insulating substrate 602 to the second circuit board 30. It will be noted that descriptions of the insulating substrate 602 is similar to that of the second substrate 35, and details will not be repeated here. In addition, a type of the first double-sided adhesive tape 601 is not limited in the embodiments of the present disclosure. For example, in order to reduce cost, the first double-sided adhesive tape 601 may be a double-sided adhesive tape of the type TESA 4972/8854.

Figure 8:
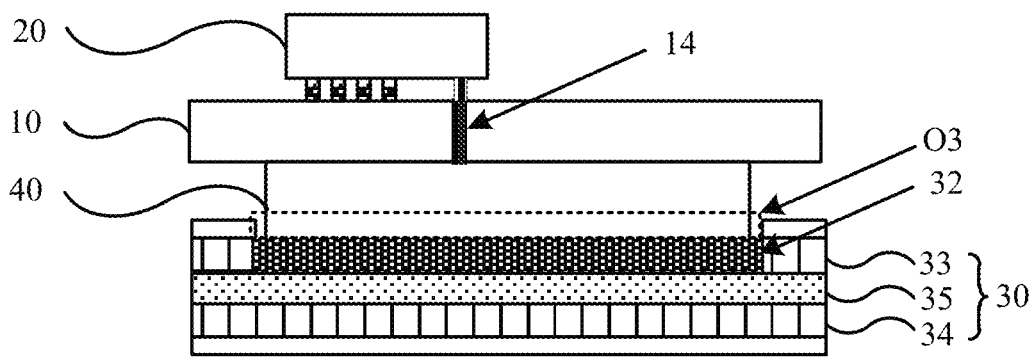
FIG. 8 is yet another cross-sectional view of a circuit board module in FIG. 1 taken along the I-I direction.

Based on this, in some embodiments of the present disclosure, an arrangement manner of the second ground portion 32 is shown in FIG. 8, and the second ground portion 32 is disposed in a same layer and made of a same material as the fourth metal pattern layer 33. Due to an existence of the third opening O3, the second ground portion 32 may be exposed, so that the conductive connection portion 40 may be directly bonded to and electrically connected to the second ground portion 32, and there is no need to provide a via hole for a connection of the conductive connection portion 40 and the second ground portion 32. As a result, a process is simple. In addition, in order to further simplify the process, the second ground portion 32 and the fourth metal pattern layer 33 may be formed by a same photolithography process.

It will be noted that the photolithography process may include processes such as exposure, development, and etching. The following photolithography processes may all adopt the process, which will not be repeated hereinafter. In addition, in FIG. 8, the second ground portion 32 and the fourth metal pattern layer 33 are represented by different patterns, which are only for distinguishing the two, and do not represent that the second ground portion 32 and the fourth metal pattern layer 33 are made of different materials. In the following figures, descriptions involving the same layer and the same material but using two patterns is similar thereto, and will not be repeated hereinafter.

Figure 9:
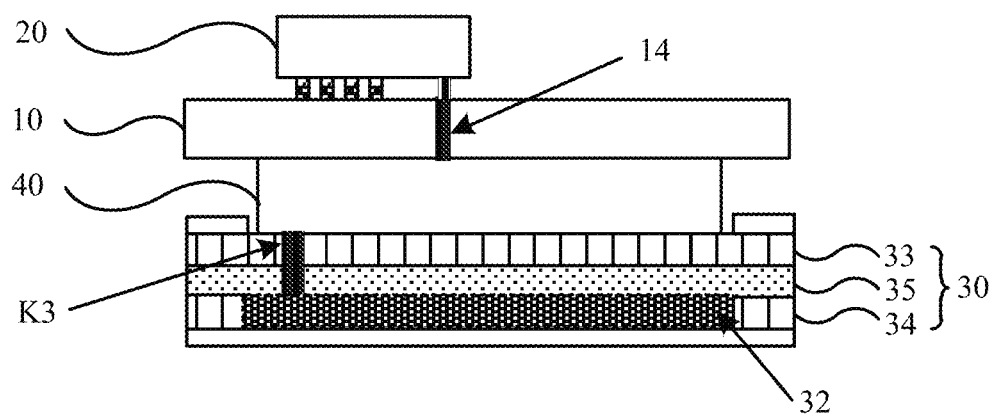
FIG. 9 is yet another cross-sectional view of a circuit board module in FIG. 1 taken along the I-I direction.

For another example, another arrangement manner of the second ground portion 32 is shown in FIG. 9, and the second ground portion 32 is disposed in a same layer and made of a same material as the fifth metal pattern layer 34. In this case, the second circuit board 30 further includes a third via hole K3 penetrating the fourth metal pattern layer 33 and the second substrate 35. A first end of the third via hole K3 is electrically connected to the conductive connection portion 40, and a second end of the third via hole K3 is electrically connected to the second ground portion 32. In this case, the conductive connection portion 40 may be electrically connected to the second ground portion 32 through the third via hole K3. In addition, in order to further simplify the process, for example, the second ground portion 32 and the fifth metal pattern layer 34 may be formed by a same photolithography process.

In order to simplify the figures, the following embodiments are described by considering an example, as shown in FIG. 8, in which the second ground portion 32 is disposed in the same layer and made of the same material as the fourth metal pattern layer 33.

Figure 10:
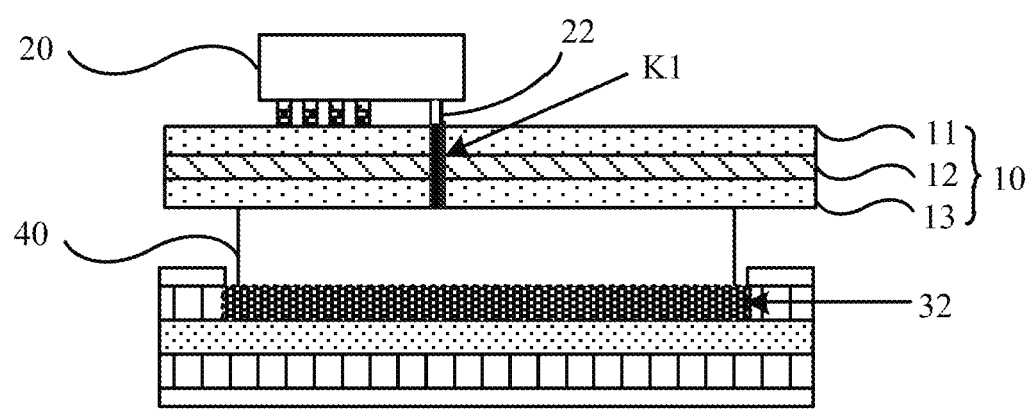
FIG. 10 is yet another cross-sectional view of a circuit board module in FIG. 1 taken along the I-I direction.

Based on this, in some embodiments of the present disclosure, as shown in FIG. 10, the first circuit board 10 may include a first metal pattern layer 11, a second metal pattern layer 13, and a first substrate 12 between the first metal pattern layer 11 and the second metal pattern layer 13. It will be noted that descriptions of the first substrate 12 is similar to that of the second substrate 35, which will not be repeated here. In addition, constituent materials and thicknesses of the first substrate 12 and the second substrate 35 may be same or different.

In some embodiments of the present disclosure, the first ground portion 14 may include first via hole(s) K1 (as shown in FIG. 10) penetrating the first circuit board 10. A first end of a first via hole K1 is electrically connected to a ground pin 22 of the touch chip 20, and a second end of the first via hole K1 is electrically connected to the conductive connection portion 40. In this case, in the embodiments of the present disclosure, the grounding network for the touch chip 20 may include the ground pin(s) 22, the first via hole(s) K1, the conductive connection portion 40 and the second ground portion 32. In this case, only by providing the first via hole(s) K1 in the first ground portion 14, the touch chip 20 may be connected to the grounding network, and the grounding for the touch chip 20 may be realized. Therefore, the process is simple and has a low cost.

It will be noted that, in order to realize an electrical connection between the ground pin 22 and the conductive connection portion 40 through the first via hole K1, the first via hole K1 may be filled with a metal material. A type of the metal material is not limited in the embodiments of the present disclosure. In the following, a manner in which two components are electrically connected through a via hole is similar to the above description, which will not be repeated below.

Figure 11:
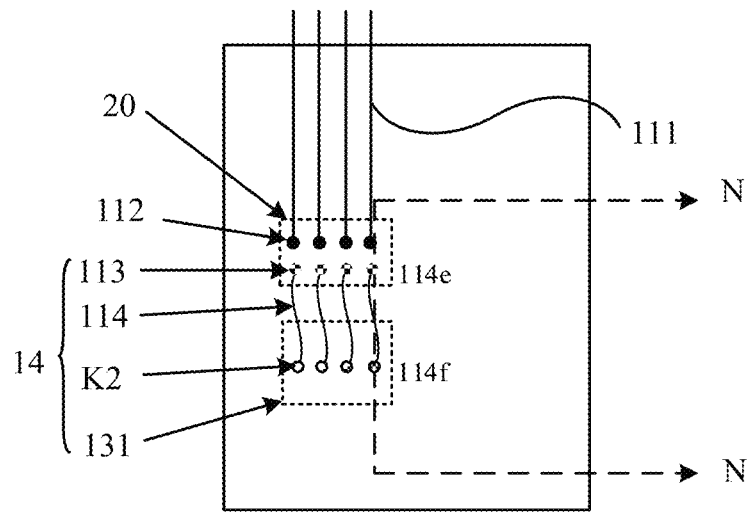
FIG. 11 is a diagram showing a structure of yet another touch display apparatus, in accordance with some embodiments.
Figure 12:
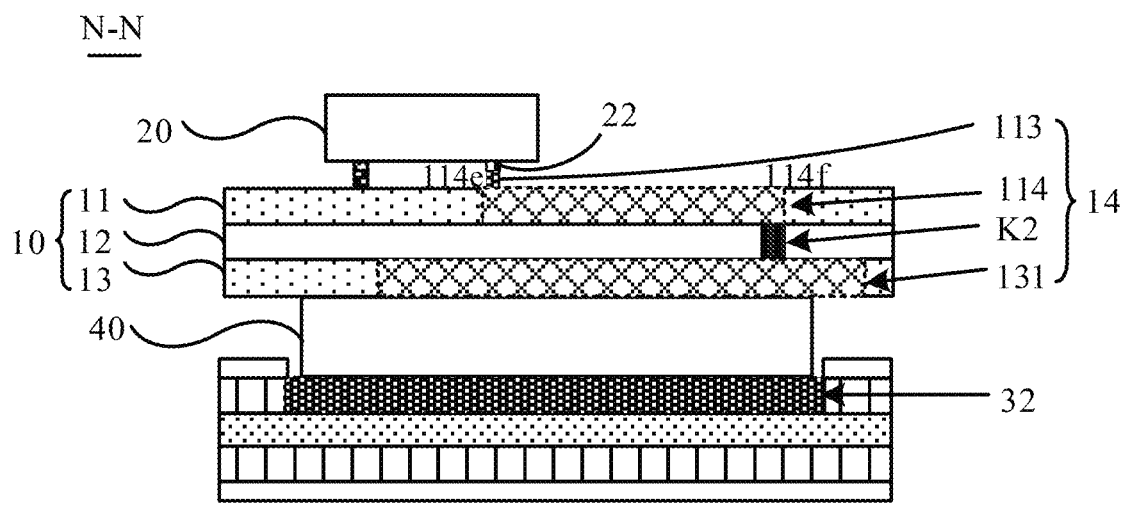
FIG. 12 is a cross-sectional view of a circuit board module in FIG. 11 taken along the N-N direction.

In some other embodiments of the present disclosure, as shown in FIG. 11, the first ground portion 14 may include a plurality of ground pads 113, a plurality of first ground leads 114, a plurality of second via holes K2 and a metal ground pattern 131. As shown in FIG. 12 (FIG. 12 is a cross-sectional view taken along the N-N direction in FIG. 11), the first ground leads 114 are disposed in a same layer and made of a same material as the first metal pattern layer 11, the metal ground pattern 131 is disposed in a same layer and made of a same material as the second metal pattern layer 13, and the metal ground pattern 131 is a zero-potential region with a certain area. In this case, a connection relationship of the grounding network for the touch chip 20 is as follows: a ground pad 113 is electrically connected to the ground pin 22 and a first end 114e of a first ground lead 114. A first end of a second via K2 is electrically connected to a second end 114f of the first ground lead 114, and a second end of the second via K2 is electrically connected to the metal ground pattern 131. In addition, the metal ground pattern 131 is further electrically connected to the second ground portion 32 through the conductive connection portion 40.

In some embodiments of the present disclosure, a ratio of an area of the metal ground pattern 131 to an area of the first circuit board 10 is R, and the ratio R may be greater than or equal to 0.1 and less than or equal to 0.2 (0.1≤R≤0.2). In a case where the ratio R is less than 0.1, the area of the metal ground pattern 131 is small, which results in a poor effect on reducing grounding impedance of the touch chip 20. In a case where the ratio R is greater than 0.2, a wiring space for the touch lines 111 of the first circuit board 10 will be reduced, which is not beneficial to a wiring of the touch lines 111. Therefore, in a case where the ratio R is within the above range, the grounding impedance of the touch chip 20 may be significantly reduced while satisfying a reasonable wiring space for the first circuit board 10, thereby improving the anti-static capability of the touch chip 20. It will be noted that, a shape of the metal ground pattern 131 is not limited in the embodiments of the present disclosure.

In this case, the grounding network for the touch chip 20 includes the plurality of first ground leads 114, which is equivalent to increasing network channels of discharge for the touch chip 20. Moreover, the plurality of second via holes K2 are provided in the grounding network, which is equivalent to connecting the plurality of first ground leads 114 to the metal ground pattern 131 in parallel, so that impedance between the plurality of first ground leads 114 and the metal ground pattern 131 may be reduced, and in turn, the grounding impedance of the touch chip 20 may be reduced. As a result, the anti-static capability of the touch chip 20 may be further enhanced.

In some embodiments of the present disclosure, the first ground leads 114 are disposed in the same layer and made of the same material as the first metal pattern layer 11, which may refer to that: the plurality of first ground leads 114 are disposed in a same layer and made of a same material as the plurality of touch lines 111, and the first ground leads 114 are insulated from the touch lines 111. In some embodiments of the present disclosure, in order to simplify the process, the plurality of first ground leads 114 and the plurality of touch lines 111 may be formed by using a same photolithography process. In addition, the area of the first circuit board 10 is smaller than the area of the second circuit board 30, and the area of the metal ground pattern 131 is smaller than the area of the second ground portion 32.

Figure 13:
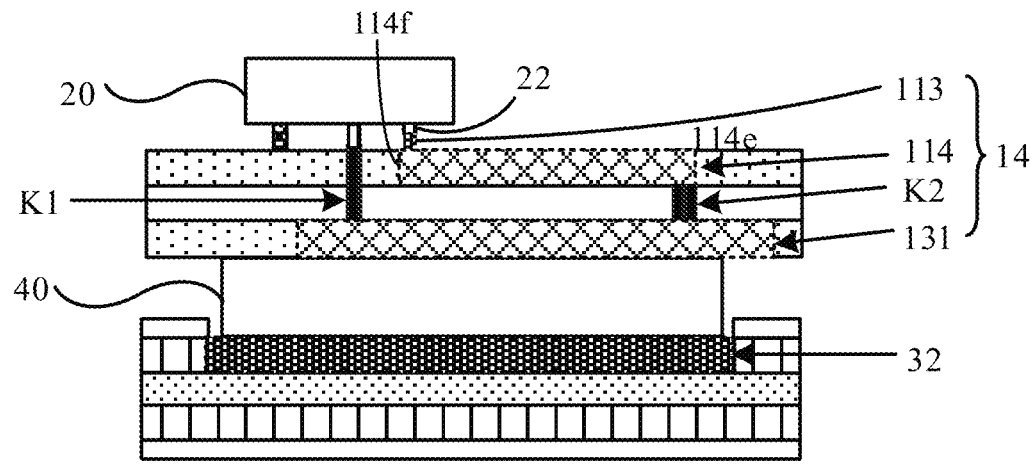
FIG. 13 is yet another cross-sectional view of a circuit board module in FIG. 1 taken along the I-I direction.

In some other embodiments of the present disclosure, as shown in FIG. 13, the circuit board module 300 may adopt the two arrangement manners, shown in FIGS. 10 and 12, of the first ground portion 14. In this case, two functions of both simplifying the process and improving the anti-static capability of the touch chip 20 may be realized. In order to simplify the figures, the following embodiments are described by considering an example in which the first ground portion 14 includes the first via hole K1.

Figure 14:
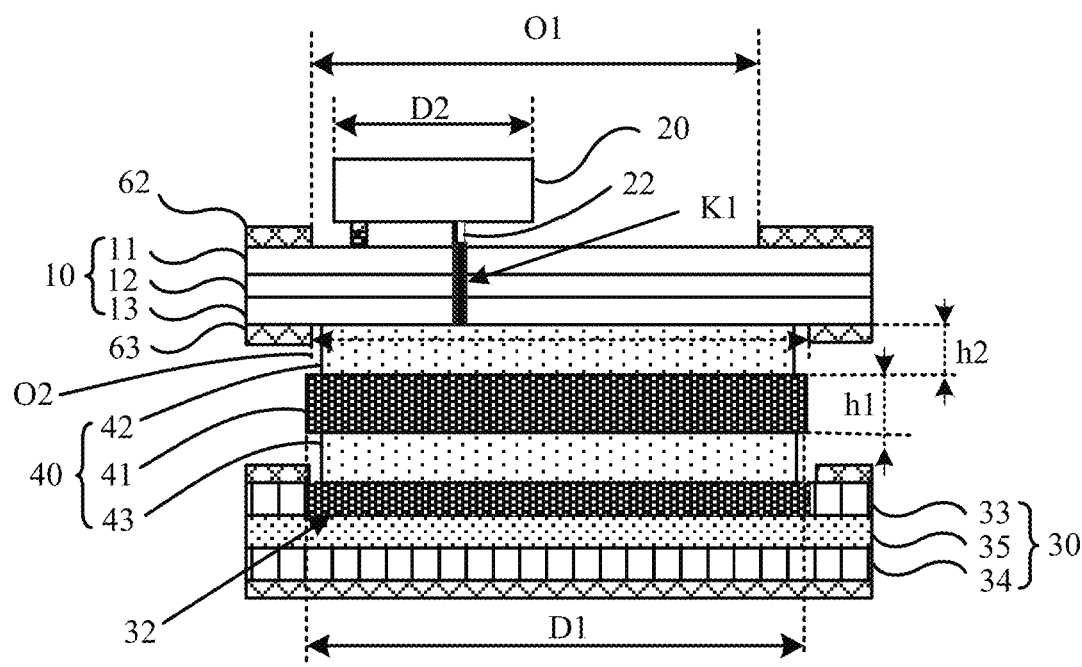
FIG. 14 is yet another cross-sectional view of a circuit board module in FIG. 1 taken along the I-I direction.

In some embodiments of the present disclosure, as shown in FIG. 14, the conductive connection portion 40 may include a metal support layer 41, a first conductive adhesive 42 and a second conductive adhesive 43. The metal support layer 41 is located on a side of the first conductive adhesive 42 away from the first ground portion 14, and the first conductive adhesive 42 is located between the metal support layer 41 and the first ground portion 14, and bonds the metal support layer 41 to the first ground portion 14. The second conductive adhesive 43 is located between the metal support layer 41 and the second ground portion 32 of the second circuit board 30, and bonds the metal support layer 41 to the second ground portion 32.

In this case, the grounding network for the touch chip 20 includes the ground pin 22, the first via hole K1, the first conductive adhesive 42, the metal support layer 41, the second conductive adhesive 43 and the second ground portion 32 that are electrically connected in sequence. Since the first conductive adhesive 42, the metal support layer 41 and the second conductive adhesive 43 are added, which is equivalent to adding grounding network channels of the touch chip 20, the grounding effect may be further enhanced.

In addition, in some embodiments of the present disclosure, the metal support layer 41 may be a flat plate with a certain thickness and strength. In this way, the metal support layer 41 may further serve to flatten and support the touch chip 20 located on the first circuit board 10, so as to avoid a poor soldering phenomenon when the signal pins 21 of the touch chip 20 are soldered to the signal pads 112. Moreover, the metal support layer 41 may further serve to flatten and support the second circuit board 30.

In some embodiments of the present disclosure, the thickness $h_1$ of the metal support layer 41 may be greater than or equal to 0.05 mm and less than or equal to 0.3 mm (0.05 mm≤$h_1$≤0.3 mm). In a case where the thickness $h_1$ is less than 0.05 mm, the metal support layer 41 is too thin to support device(s) located thereon and prevent poor soldering. In a case where the thickness $h_1$ is greater than 0.3 mm, it is easy to cause waste of resources and increase production costs, and it is not beneficial to a thin and light design of a whole machine (i.e., the touch display apparatus). For example, the thickness h1 of the metal support layer 41 may be 0.1 mm, 0.15 mm, or 0.2 mm. In this case, the thickness of the metal support layer 41 is appropriate, which may ensure the flatness of the device(s) (such as the touch chip) located on the metal support layer 41 during a soldering process, so that the device(s) may be prevented from poor soldering. Moreover, it may not cause the waste of the resources, and satisfy the light and thin design of the whole machine.

It will be noted that a material and a shape of the metal support layer 41 are not limited in the embodiments of the present disclosure. For example, in order to make the metal support layer 41 have certain strength and flatness, the metal support layer 41 may be a whole flat plate made of a stainless steel material.

In some embodiments of the present disclosure, a thickness h2 of the first conductive adhesive 42 may be greater than or equal to 0.02 mm and less than or equal to 0.08 mm (0.02 mm≤h2≤0.08 mm). In a case where the thickness h2 of the first conductive adhesive 42 is less than 0.03 mm, a film layer of the first conductive adhesive 42 is too thin, so that a bonding effect between the metal support layer 41 and the first ground portion 14 is poor. In a case where the thickness h2 of the first conductive adhesive 42 is greater than 0.06 mm, it will cause waste of resources, and is not beneficial to the thin and light design of the whole machine. For example, the thickness h2 of the first conductive adhesive 42 may be 0.04 mm, 0.05 mm, or 0.06 mm. In this case, the thickness h2 of the first conductive adhesive 42 is moderate, the bonding effect between the metal support layer 41 and the first ground portion 14 is good, and it may satisfy the light and thin design of the whole machine.

It will be noted that constituent materials of the first conductive adhesive 42 are not limited in the embodiments of the present disclosure, as long as the first conductive adhesive 42 has both adhesive and conductive properties. In addition, the constituent materials of the first conductive adhesive 42 and the second conductive adhesive 43 may be same or different.

In order to protect the first metal pattern layer 11 and the second metal pattern layer 13, with continued reference to FIG. 14, the circuit board module 300 further includes a first insulating layer 62 and a second insulating layer 63. The first insulating layer 62 is located on a side of the first metal pattern layer 11 away from the first substrate 12 and bonded to the first metal pattern layer 11. The second insulating layer 63 is located on a side of the second metal pattern layer 13 away from the first substrate 12 and bonded to the second metal pattern layer 13. In this way, the first insulating layer 62 and the second insulating layer 63 are provided on the first circuit board 10, so that insulating protection may be performed on the first metal pattern layer 11 and the second metal pattern layer 13.

Based on this, the first insulating layer 62 is provided with a first opening O1. In this case, the touch chip 20 is disposed in the first opening O1. In addition, the second insulating layer 63 is provided with a second opening O2. In this case, the conductive connection portion 40 is disposed in the second opening O2.

It will be noted that descriptions of the first insulating layer 62 and the second insulating layer 63 are each similar to that of the third insulating layer 60, and details are not repeated here. In addition, the first insulating layer 62, the second insulating layer 63, the third insulating layer 60 and the fourth insulating layer 61 may have a same structure and material or may have different structures and materials.

In some embodiments of the present disclosure, as shown in FIG. 14, in a case where the metal support layer 41 is only used for supporting the touch chip 20, a maximum length D1 of the metal support layer 41 is greater than a maximum length D2 of the touch chip 20. In this way, an orthographic projection of the touch chip 20 on the second circuit board 30 is completely within an orthographic projection of the metal support layer 41 on the second circuit board 30. In this case, the metal support layer 41 may provide a good support for the touch chip 20.

Figure 15:
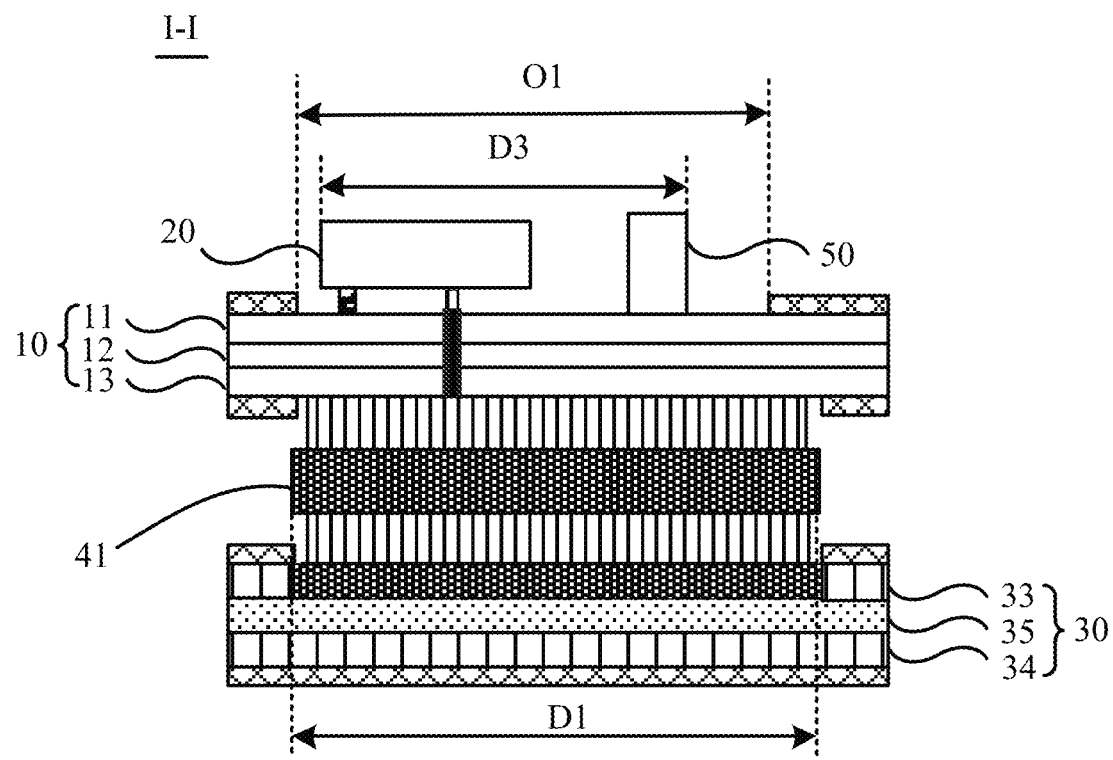
FIG. 15 is yet another cross-sectional view of a circuit board module in FIG. 1 taken along the I-I direction.

In some other embodiments of the present disclosure, as shown in FIG. 15, in order to prevent shocks of transient voltages, the circuit board module 300 may further include transient voltage suppressor(s) (TVS(s)) 50. The TVS(s) 50 are electrically connected to the first circuit board 10 and located in the first opening O1. In this case, the maximum length D1 of the metal support layer 41 is greater than a maximum length D3 of a region where the touch chip 20 and the TVS(s) 50 are located.

In this way, an orthogonal projection of the region where the touch chip 20 and the TVS 50 are located on the second circuit board 30 is completely within the orthographic projection of the metal support layer 41 on the second circuit board 30, so that the metal support layer may provide a good support for the touch chip 20 and the TVS and prevents the poor soldering during the soldering process.

In some other embodiments of the present disclosure, in a case where the first circuit board 10 is provided with other device(s) thereon, similar to the above, an orthogonal projection of a region where all devices are located on the second circuit board 30 is within the orthographic projection of the metal support layer 41 on the second circuit board 30. In this way, the metal support layer 41 may provide a good support for all the devices located on the first circuit board 10, and ensure the flatness required by the devices during soldering.

Figure 16:
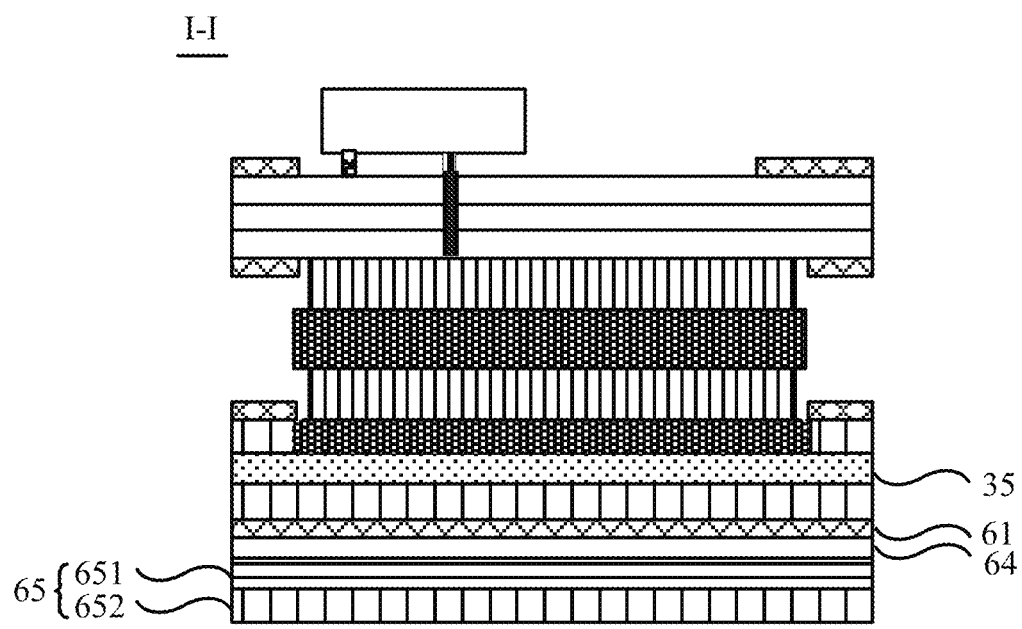
FIG. 16 is yet another cross-sectional view of a circuit board module in FIG. 1 taken along the I-I direction.

In some embodiments of the present disclosure, as shown in FIG. 16, the circuit board module 300 further includes an electromagnetic shielding layer 64. The electromagnetic shielding layer 64 is located on a side of the fourth insulating layer 61 away from the second substrate 35 and bonded to the fourth insulating layer 61. The electromagnetic shielding layer 64 is provided in the circuit board module 300, so that electromagnetic interference of the touch display apparatus 100 to the second circuit board 30 may be shielded.

In addition, the circuit board module 300 may further include a carrier plate 65. The carrier plate 65 may include a foam 651 and a grid adhesive 652. The foam 651 is located on a side of the electromagnetic shielding layer 64 away from the fourth insulating layer 61 and bonded to the electromagnetic shielding layer 64. The grid adhesive 652 is located on a side of the foam 651 away from the electromagnetic shielding layer 64 and bonded to the foam 651. In this case, the carrier plate 65 is provided in the circuit board module 300, so that the carrier plate 65 may buffer the circuit board module 300, thereby preventing the abnormality of the circuit board module 300 due to an external collision.

Figure 17:
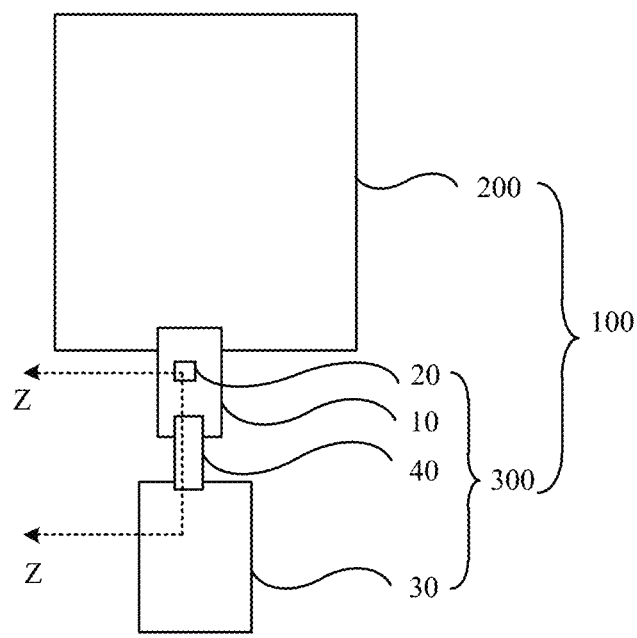
FIG. 17 is a diagram showing a structure of yet another touch display apparatus, in accordance with some embodiments.

Example 2: as shown in FIG. 17, this example differs from Example 1 in that the first circuit board 10 and the second circuit board 30 are arranged side by side. Since the first circuit board 10 and the second circuit board 30 are electrically connected to the touch display screen 200 through pins on different sides in this example, the first circuit board 10 and the second circuit board 30 may be arranged side by side.

In addition, this example is same as Example 1 in that, as shown in FIG. 17, the touch display apparatus 100 includes the touch display screen 200 and the circuit board module 300. The circuit board module 300 includes the first circuit board 10, the touch chip 20, the second circuit board 30 and at least one conductive connection portion 40. The first circuit board 10 is electrically connected to the touch display screen 200 and the touch chip 20. The second circuit board 30 is electrically connected to the touch display screen 200.

Figure 18:
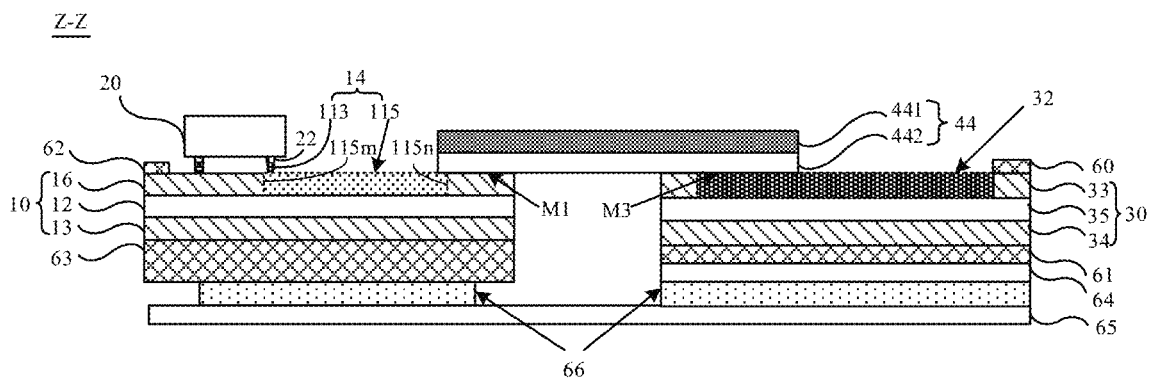
FIG. 18 is a cross-sectional view of a circuit board module in FIG. 17 taken along the Z-Z direction.

In some embodiments of the present disclosure, as shown in FIG. 18 (FIG. 18 is a cross-sectional view taken along the Z-Z direction in FIG. 17), the first circuit board 10 and the second circuit board 30 are arranged side by side on a carrier plate 65. The first circuit board 10 includes a first surface M1 away from the carrier plate 65, and the second circuit board 30 includes a third surface M3 away from the carrier plate 65. The at least one conductive connection portion 40 may include a conductive fabric 44 (also referred to as a first conductive connection portion). The conductive fabric 44 is located on a side where the first surface M1 and the third surface M3 are located, and may electrically connect first ground portion 14 of the first circuit board 10 to second ground portion 32 of the second circuit board 30.

It will be noted that, in this example, the description of the second ground portion 32 is similar to that of Example 1, and will not be repeated here. In this example, the description will be made in an example in which the second ground portion 32 is still disposed in the same layer and made of the same material as the fourth metal pattern layer 33.

A structure of the first ground portion 14 in this example will be described in detail below.

As shown in FIG. 18, the first circuit board 10 includes a third metal pattern layer 16, a second metal pattern layer 13, and a first substrate 12 located between the third metal pattern layer 16 and the second metal pattern layer 13. The third metal pattern layer 16 is located on a side of the first substrate 12 proximate to the touch chip 20.

It will be noted that descriptions of the second metal pattern layer 13 and the first substrate 12 are similar to those of Example 1, which are not repeated here. In addition, descriptions of the third metal pattern layer 16 are similar to those of the second metal pattern layer 13.

Based on this, as shown in FIG. 18, the first ground portion 14 includes ground pads 113 and second ground leads 115. A ground pad 113 is electrically connected to the ground pin 22 and a first end 115m of a second ground lead 115, a second end 115n of the second ground lead 115 is electrically connected to the conductive fabric 44, and the conductive fabric 44 is further electrically connected to the second ground portion 32. In this case, a grounding network for the touch chip 20 includes ground pins 22, the ground pads 113, the second ground leads 115, the conductive fabric 44 and the second ground portion 32 that are electrically connected in sequence.

In this way, the plurality of second ground leads 115 and the second ground portion 32 with a certain area are provided in the grounding network for the touch chip 20, electrostatic discharge channel of the touch chip 20 may significantly increase, thereby avoiding the touch failure caused by the open of the internal circuit of the touch chip 20 due to the instantaneous large current generated during the ESD test.

In some embodiments of the present disclosure, the plurality of second ground leads 115 may be disposed in a same layer and made of a same material as the third metal pattern layer 16. In order to simplify the process, the second ground leads 115 and the third metal pattern layer 16 may be formed by a same photolithography process. It will be noted that, in FIG. 18, descriptions of which the second ground leads 115 and the third metal pattern layer 16 are represented by different patterns are similar to those in Example 1, and will not be repeated here.

It will be noted that a first insulating layer 62, a second insulating layer 63, a third insulating layer 60, a fourth insulating layer 61, and an electromagnetic shielding layer 64 that are included in the circuit board module 300 in Example 2 are similar in arrangement to those in Example 1, and details will not be repeated here.

In addition, in order to bond the first circuit board 10 to the carrier plate 65 and to bond the electromagnetic shielding layer 64 to the carrier plate 65, the circuit board module 300 further includes a second double-sided adhesive tape 66. An arrangement of the second double-sided adhesive tape 66 is same as that of the first double-sided adhesive tape 601, and will not be repeated here. The second double-sided adhesive tape 66 may be the same as or different from the first double-sided adhesive tape 601. In addition, descriptions of the carrier plate 65 are similar to those in Example 1, and will not be repeated here.

With continued reference to FIG. 18, in some embodiments of the present disclosure, the conductive fabric 41 may include a non-woven fabric 441 and a third conductive adhesive 442 that are stacked. The third conductive adhesive 442 is proximate to the first circuit board 10 and the second circuit board 30. Descriptions of the third conductive adhesive 442 is similar to those of the first conductive adhesive 42 in Example 1, and will not be repeated here. A material of the non-woven fabric 441 is not limited in the embodiments of the present disclosure.

Figure 19:
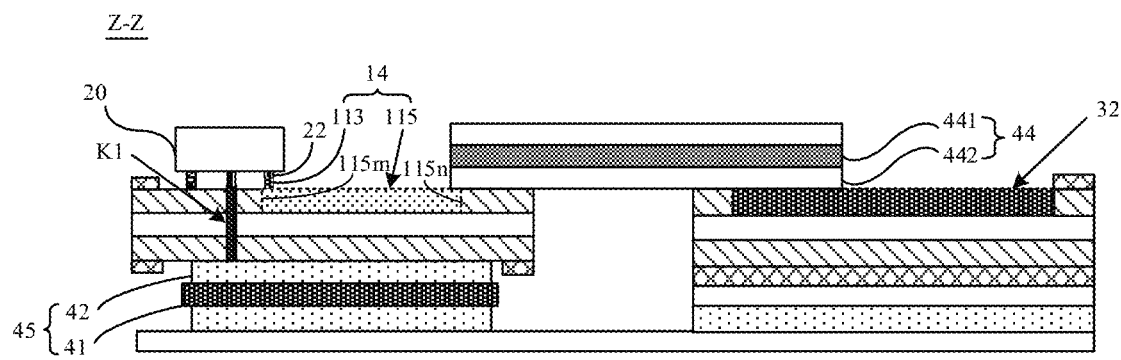
FIG. 19 is another cross-sectional view of a circuit board module in FIG. 17 taken along the Z-Z direction.

In some other embodiments of the present disclosure, as shown in FIG. 19, the at least one conductive connection portion 40 further includes a second conductive connection portion 45. The second conductive connection portion 45 includes a metal support layer 41 and a first conductive adhesive 42. In addition, in order to further increase an ESD channel of the touch chip 20, the first ground portion 14 further includes a first conductive via hole K1 penetrating the first circuit board 10. Descriptions of the metal support layer 41, the first conductive adhesive 42 and the first via hole K1 are similar to those in Example 1, and will not repeated here.

In this case, the grounding network for the touch chip 20 includes two parts. One part is the ground pins 22, the ground pads 113, the second ground leads 115, the third conductive adhesive 442 and the second ground portion 32 that are electrically connected in sequence, and another part is the ground pin 22, the first via hole K1, the first conductive adhesive 42 and the metal support layer 41 that are electrically connected in sequence. The grounding network for the touch chip 20 in this embodiment becomes large due to the metal support layer 41, which is equivalent to increasing the discharge channel of the touch chip 20, and thus the antistatic capability of the touch chip 20 may be further enhanced.

In addition, the metal support layer 41 may further provide a good support for the touch chip 20 located on the first circuit board 10, and avoid a poor soldering phenomenon when the ground pins 22 of the touch chip 20 are soldered to the ground pads 113.

In some other embodiments of the present disclosure, the metal support layer 41 may also be replaced with a reinforced PI having a certain thickness and strength. Correspondingly, in this case, the first conductive adhesive 42 may be replaced with a common double-sided adhesive tape.

In this way, while a supporting and reinforcing effect on the touch chip 20 is realized, the cost may also be saved. It will be noted that, the thickness of the reinforced PI may be same as the thickness of the metal support layer 41, which will not be repeated here.

The foregoing descriptions are merely specific implementations of the present disclosure. However, the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A circuit board module, comprising:
   a touch chip including at least one ground pin and a plurality of signal pins;
   a first circuit board including a first ground portion and a plurality of signal pads; the signal pads being electrically connected to the signal pins; the first ground portion being electrically connected to the at least one ground pin;
   a second circuit board including a second ground portion; and
   at least one conductive connection portion electrically connected to the first ground portion and the second ground portion, wherein
   a ratio of an area of the second ground portion to an area of the second circuit board is in a range of 0.1 to 0.2, inclusive.

2. The circuit board module according to claim 1, wherein the first circuit board includes a first surface and a second surface that are disposed oppositely;
   the plurality of signal pads are located on the first surface; the touch chip is located on the first surface; and the second circuit board is located on a side of the second surface away from the touch chip;
   the conductive connection portion is located between the first circuit board and the second circuit board.

3. The circuit board module according to claim 2, wherein the conductive connection portion includes:
   a metal support layer located on the side of the second surface away from the touch chip;
   a first conductive adhesive located between the metal support layer and the first circuit board and used for bonding and electrically connecting the metal support layer to the first circuit board; and
   a second conductive adhesive located between the metal support layer and the second circuit board and used for bonding and electrically connecting the metal support layer to the second circuit board.

4. The circuit board module according to claim 3, wherein a thickness of the metal support layer is in a range of 0.05 mm to 0.3 mm, inclusive; and/or
   a thickness of the first conductive adhesive is in a range of 0.02 mm to 0.08 mm, inclusive.

5. The circuit board module according to claim 3, wherein the metal support layer is a whole flat plate made of a stainless steel material.

6. The circuit board module according to claim 3, wherein an orthographic projection of the touch chip on the second circuit board is completely within an orthographic projection of the metal support layer on the second circuit board.

7. The circuit board module according to claim 2, wherein the first ground portion includes at least one first via hole penetrating the first circuit board; a first end of a first via hole is electrically connected to a ground pin of the touch chip, and a second end of the first via hole is electrically connected to a conductive connection portion.

8. The circuit board module according to claim 2, wherein the first circuit board includes a first metal pattern layer, a second metal pattern layer, and a first substrate located between the first metal pattern layer and the second metal pattern layer;
   the first ground portion includes:
   a plurality of ground pads, a ground pad being electrically connected to a ground pin;
   a plurality of first ground leads, a first end of a first ground lead being electrically connected to the ground pad, the plurality of first ground leads being disposed in the first metal pattern layer;
   a plurality of second via holes, a first end of a second via hole being electrically connected to a second end of the first ground lead, the second via holes penetrating the first substrate; and
   a metal ground pattern electrically connected to a second end of the second via hole and the conductive connection portion, the metal ground pattern being disposed in the second metal pattern layer.

9. The circuit board module according to claim 8, wherein a ratio of an area of the metal ground pattern to an area of the first circuit board is in a range of 0.1 to 0.2, inclusive; and/or
   the area of the metal ground pattern is smaller than the area of the second ground portion.

10. The circuit board module according to claim 8, wherein
    at least one of the first metal pattern layer and the second metal pattern layer includes a plurality of touch lines; and first ends of the touch lines are electrically connected to the touch chip.

11. The circuit board module according to claim 10, further comprising:
    a first insulating layer located on a side of the first metal pattern layer away from the first substrate and bonded to the first metal pattern layer; the first insulating layer being provided with a first opening therein, and the touch chip being disposed in the first opening; and
    a second insulating layer located on a side of the second metal pattern layer away from the first substrate and bonded to the second metal pattern layer; the second insulating layer being provided with a second opening therein, and the conductive connection portion being disposed in the second opening.

12. The circuit board module according to claim 11, further comprising at least one transient voltage suppressor (TVS) electrically connected to the first circuit board and located in the first opening.

13. The circuit board module according to claim 12, wherein an orthogonal projection of a region where the touch chip and the TVS are located on the second circuit board is completely within an orthographic projection of the metal support layer on the second circuit board.

14. The circuit board module according to claim 1, wherein the second circuit board includes a fourth metal pattern layer, a fifth metal pattern layer, and a second substrate located between the fourth metal pattern layer and the fifth metal pattern layer; and
    the second ground portion is disposed in the fourth metal pattern layer; or
    the second ground portion is disposed in the fifth metal pattern layer; the second circuit board further includes a third via hole; the third via hole penetrating the fourth metal pattern layer and the second substrate; a first end of the third via hole is electrically connected to the conductive connection portion, and a second end of the third via hole is electrically connected to the second ground portion.

15. The circuit board module according to claim 14, wherein
at least one of the fifth metal pattern layer and the fourth metal pattern layer includes a plurality of display signal lines.

16. The circuit board module according to claim 14, further comprising:
a third insulating layer located on a side of the fourth metal pattern layer away from the second substrate and bonded to the fourth metal pattern layer, the third insulating layer being provided with a third opening therein, and the at least one conductive connection portion being disposed in the third opening; and
a fourth insulating layer located on a side of the fifth metal pattern layer away from the second substrate and bonded to the fifth metal pattern layer.

17. The circuit board module according to claim 16, wherein the third insulating layer includes an insulating substrate and a first double-sided adhesive tape; the first double-sided adhesive tape is located between the insulating substrate and the second circuit board, and is configured to bond the insulating substrate to the second circuit board.

18. The circuit board module according to claim 16, further comprising:
an electromagnetic shielding layer located on a side of the fourth insulating layer away from the second substrate.

19. The circuit board module according to claim 18, further comprising a carrier plate, wherein the carrier plate includes:
a foam located on a side of the electromagnetic shielding layer away from the fourth insulating layer; and
a grid adhesive located on a side of the foam away from the electromagnetic shielding layer.

20. A touch display apparatus, comprising:
a touch display screen; and
a circuit board module, including:
a touch chip including at least one ground pin and a plurality of signal pins;
a first circuit board electrically connected to the touch display screen; the first circuit board including a first ground portion and a plurality of signal pads; the signal pads being electrically connected to the signal pins, so that the touch chip is electrically connected to the touch display screen through the first circuit board; the first ground portion being electrically connected to the at least one ground pin;
a second circuit board including a second ground portion; and
at least one conductive connection portion electrically connected to the first ground portion and the second ground portion, wherein
a ratio of an area of the second ground portion to an area of the second circuit board is in a range of 0.1 to 0.2, inclusive.

* * * * *